United States Patent

Tsujimoto

[11] Patent Number: 5,258,953
[45] Date of Patent: Nov. 2, 1993

[54] SEMICONDUCTOR MEMORY DEVICE
[75] Inventor: Akira Tsujimoto, Tokyo, Japan
[73] Assignee: NEC Corporation, Tokyo, Japan
[21] Appl. No.: 904,252
[22] Filed: Jun. 25, 1992
[30] Foreign Application Priority Data
Jun. 27, 1991 [JP] Japan .................. 3-183102
[51] Int. Cl.⁵ .............................. G11C 8/00
[52] U.S. Cl. ..................... 365/200; 365/225.7; 365/230.06
[58] Field of Search .......... 365/200, 225.7, 230.06
[56] References Cited

U.S. PATENT DOCUMENTS

| | | | |
|---|---|---|---|
| 4,586,170 | 4/1986 | O'Toole et al. | 365/200 |
| 4,587,639 | 5/1986 | Aoyama et al. | 365/200 |
| 4,723,227 | 2/1988 | Murotani | 365/200 |
| 4,951,253 | 8/1990 | Sahara et al. | 365/200 |

Primary Examiner—Eugene R. LaRoche
Assistant Examiner—D. Hyun Yoo
Attorney, Agent, or Firm—Young & Thompson

[57] ABSTRACT

In a redundant memory device, the redundant memory device is provided which is characterized in that the supply of a driving pulse to a comparison and selection device which generates an activating pulse of a reserve row/column in response to the result of comparison of the address of a defective memory cell and an input address code can be programmed so as to be inhibited for a surplus comparison and selection device during the inspection process. By this arrangement, the power consumption in the comparison and selection device can be reduced, and high level of integration of the memory chip can be facilitated accordingly.

11 Claims, 5 Drawing Sheets

SEMICONDUCTOR MEMORY DEVICE

BACKGROUND OF THE INVENTION

1. Field of the Invention

The present invention relates to a semiconductor memory device, and more particularly to a redundant memory device which can replace defective memory cells (referred to as defective cells hereinafter) within an ordinary memory cell array by reserve memory cells (referred to as reserve cells hereinafter) formed on the same memory chip.

2. Description of the Prior Art

High level of integration and large memory capacity of semiconductor memory devices have been advancing steadily, and the memory capacity per memory chip has been increased at a rate of quadruple in about three years. Four megabit dynamic random access memory (referred to as dram hereinafter) is now already being mass produced, and 16 M DRAM is showing up in the market.

Accompanying the advancement in the high level of integration and the large memory capacity, the probability of including defective cells in the memory cell array is being increased. Under these circumstances, it has been general practice, since the time of the introduction of the 64k DRAM, to employ a technique of suppressing the reduction of the yield for memory production by providing on the memory chip a means for replacing defective cells by reserve cells.

A redundant memory device of the above-mentioned type has an ordinary memory cell array which includes a large number of word lines arranged parallel with each other in row direction and a large number of bit lines arranged parallel with each other in column direction and a large number of memory cells arranged respectively at the intersections of these word lines and these bit lines, a row decoder and a column decoder which selects one of the word lines and one of the bit lines, respectively, in response to an input address code, a large number of sense amplifiers/bit drivers that are connected respectively to the bit lines, address buffers/registers and input and output data buffers/registers that are connected respectively to the row and column decoders and the sense amplifiers/bit drivers, and a control circuit which generates required control pulse in response to a write control signal, a chip selection signal, and a timing signal, that are included as components in an ordinary memory device. In addition to the above, the device is equipped with reserve rows or reserve columns (referred to as reserve rows/columns hereinafter) which consist of a large number of reserve memory cells (referred to as reserve cells hereinafter) that are arranged in the row or column direction adjacent to the ordinary memory cell array, in order to make it possible to replace functionally insufficient defective cells among the large number of memory cells in the unit of row or column to which these defective cells belong, and comparison and selection means which stores the address of a defective cell and selects the reserve row/column in response to the agreement between the input address code word and the address of the stored defective cell. The above-mentioned defective cell is automatically detected during the inspection process of the memory chip production by an ordinary test equipment, and its address is automatically stored in the comparison and selection means within the chip.

The comparison and selection means is equipped with a MOS switching transistor train which includes gate electrodes that respectively receive input address code words that are supplied in bit parallel mode, source electrodes that are respectively connected to the grounding potential, and drain electrodes which are connected to a driving pulse source via respective ones of a plurality of fuse elements that constitute a nonrewritable ROM that stores the address of the defective cell. The common connection side of the fuse elements that are connected to the driving pulse source is connected to the reserve rows/columns via an output circuit. When the address of the defective cell stored in the ROM agrees with the input address code word, all of the MOS switching transistors are de-energized and the driving pulse is supplied as is to the reserve rows/columns through the output circuit to activate the reserve rows/columns. When the two do not agree, the driving pulse is brought to the grounding potential through either one of the MOS switching transistors without activating the reserve rows/columns.

As described in the above, the generation of a pulse output for activation of the reserve rows/columns by the comparison and selection means is accompanied by the drop of the driving pulse to the grounding potential, and hence is accompanied by a power consumption. Moreover, since the driving pulse is also supplied in parallel to the surplus reserve rows/columns that are not needed for the replacement of the defective rows/columns, power consumption takes place in each of these surplus reserve rows/columns, which amounts to a power consumption of considerable level when considered for the memory chip as a whole. An increase in the quantity of power consumption brings about a rise of the temperature of the memory chip, making a large scale integration difficult to be accomplished.

BRIEF SUMMARY OF THE INVENTION

Object of the Invention

It is therefore the object of this invention to provide a semiconductor memory device in which the power consumption in the comparison and selection circuit that determines whether switching to the reserve row/column is necessary can be reduced.

SUMMARY OF THE INVENTION

The redundant memory device according to this invention includes the aforementioned ordinary memory cell array, reserve rows/columns consisting of reserve cells, comparison and selection means which can store in advance the addresses of defective cell detected during the inspection process among the memory cells of the memory cell array and can selectively activate the reserve rows/columns by determining whether there exists agreement between the address of the defective cell and an input address code, and means for selectively interrupting the output from the driving pulse source to the surplus comparison and selection circuits which are not required to store the addresses of the defective cells out of these comparison and selection circuits.

Since the redundant memory device according to this invention can prevent the generation of power consumption in surplus comparison and selection circuits by the aforementioned selective interrupting means, it is possible to reduce the power consumption of the memory chip as a whole.

BRIEF DESCRIPTION OF THE DRAWINGS

The above-mentioned and other objects, features, and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
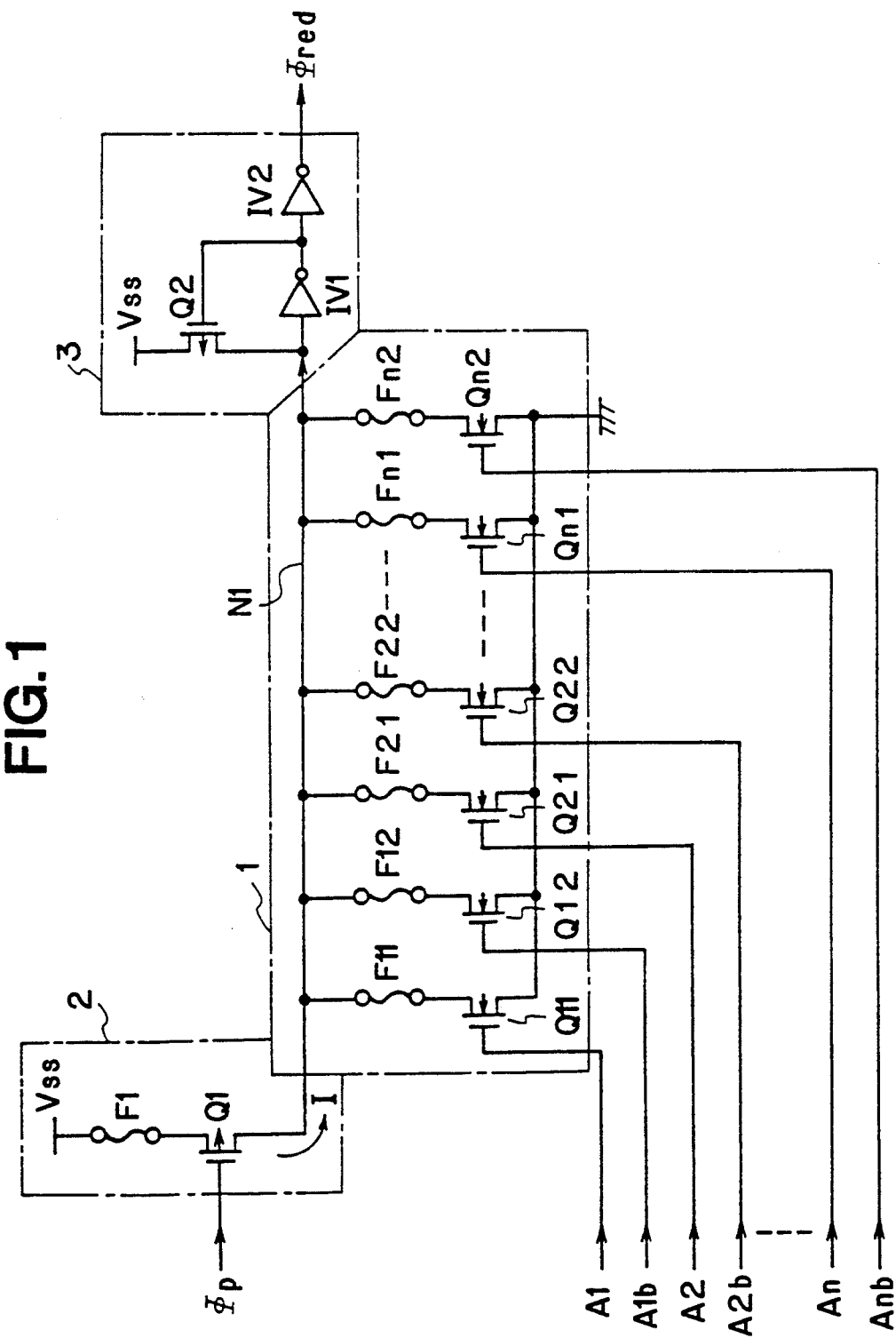
FIG. 1 is a circuit diagram for a first embodiment of the invention.

Referring to FIG. 1, the first embodiment according to this invention shown in the figure comprises a comparison and selection circuit 1 which includes storage elements (fuse elements F11, F12, ..., Fn1, and Fn2 in this embodiment) constituting ROMs that can store in nonrewritable manner the addresses of defective cells detected out of the ordinary memory cell array during the inspection process, and MOS switching transistors Q11, Q12, ..., Qn1, and Qn2 which receive bit-parallel address codes (A1, A1b, A2, A2b, ..., An and Anb) at the respective gate electrodes, having their drain electrodes connected respectively to the storage elements F11, F12, ..., Fn1, and Fn2, and their source electrodes connected in common to a grounding potential point, a driving pulse supply circuit 2 which includes a transistor Q1 that is turned on and off in response to a reserve row/column replacement control signal $\Phi_p$ and a fuse element F1 for enable inhibition, and supplies a driving pulse to a common connecting point of the storage elements of the comparison and selection circuit 1, and an output circuit 3 which includes a pair of inverter circuits IV1 and IV2 that are connected in series to the connecting point of the storage elements and a transistor Q2 with its gate electrode connected to the output of the inverter IV1, its drain electrode connected to the input of the circuit, and its source electrode connected to Vss power supply, and generates a reserve row/column activating pulse $\Phi_{red}$ when the comparison and selection circuit 1 detects agreement between the defective cell address and the input address code.

The storage of the addresses of the defective cells to the storage elements F11, F12, ..., Fn1, and Fn2 in the inspection process is accomplished by the fusion of these elements in response to the bit "1" of the corresponding input address codes. For example, if the defective cell address is "00 ... 0", the true bits A1, A2, ..., and An of the corresponding input address codes are all "0" and their complement bits A1b, A2b, ..., and Anb are all "1", so that the elements F12, F22, ..., and Fn2 that correspond to the complement bits A1b, A2b, ..., and Anb are blown. As a result, at the time when the input address codes that agree with the addresses of the defective cells are supplied to the circuit 1, the storage elements (F12, F22, ..., and Fn2) that are connected to the transistors (Q12, Q22, ..., and Qn2) that are to be turned on by receiving the bit "1" at their gate electrodes are all blown, so that the output node N1 of the circuit 1 (the common connecting point of the elements F11, F12, F21, F22, ..., Fn1, and Fn2) maintains the driving voltage from the driving circuit 2 as it is. When the input address codes do not agree with the addresses of the defective cells, there exists necessarily at least one transistor among Q11, Q12, Q21, Q22, ..., Qn1, and Qn2 that has the corresponding storage elements among F11, F12, F21, F22, ..., Fn1, and Fn2 which have not blown, and receives the bit "1" of the input address code at its gate electrode. Therefore, the potential at the output node N1 drops to the grounding potential by the action of such transistors and the connection of the intact storage elements to the grounding potential point, thereby making it possible to discriminate this case from the case of agreement between the defective cell addresses and the input address codes described in the above.

The voltage of the output node N1 of the circuit 1 undergoes level inversion by the action of the inverters IV1 and IV2 of the circuit 3 and is output as the defective row/column activating pulse $\Phi_{red}$. Since the output of the inverter IV1 is fed back to the input side by the transistor Q2, it is possible to hold the decision result as to the presence of agreement between the defective cell addresses and the input address codes even after the driving pulse from the driving circuit 2 is turned off.

The driving pulse supply circuit 2 is equipped with a transistor Q1 which receives the supply of a reserve row/column replacement control signal $\Phi_p$ at its gate electrode and has the output node N1 of the circuit 1 connected to its drain electrode, and a fuse element F1 which is inserted between the source electrode of the transistor Q1 and the Vss power terminal.

The comparison and selection circuit 1, the driving pulse supply circuit 2, and the output circuit 3 described in the above is formed on the surface of the memory chip in one to one correspondence with the reserve row/column.

Figure 2:
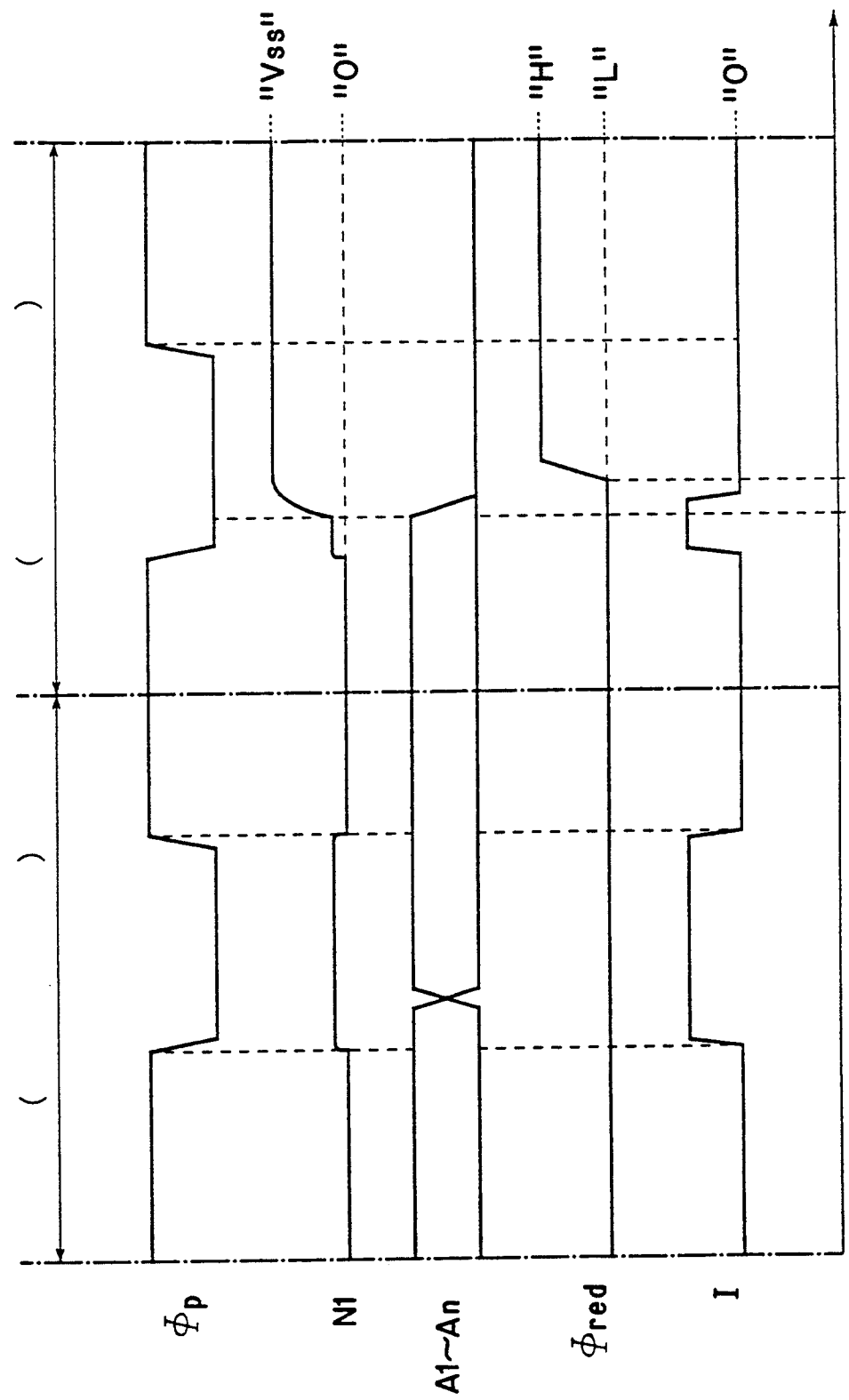
FIG. 2 is a signal waveform diagram for various parts in one operational mode of the embodiment.

Next, referring to FIG. 2, the operation of this embodiment will be described. In this embodiment, it will be assumed that the address of the defective cell is "00 ... 0" as in the above, and accordingly, the storage elements F12, F22, ..., and Fn2 have been blown in the inspection process.

When the reserve row/column replacement control signal $\Phi p$ goes to an active level (low level), the transistor Q1 is turned on. At this time, if the address codes (A1, A1b, A2, A2b, ..., An, and Anb) are out of agreement with the address (00 ... 0) of the defective cell, at least one of the serial circuits between the transistors Q11, Q12, Q21, Q22, ..., Qn1, and Qn2 and the corresponding storage elements F11, F12, F21, F22, ..., Fn1, and Fn2 forms a current path between the output node N1 and the grounding potential point, and a current I flows to the grounding potential point through this current path. In this case, the potential of the output node N1 is determined by the ratios of the on-resistances of the transistor Q1 and the transistors Q11, Q12, Q22, ..., Qn1, and Qn2, so that the reserve row/column activating pulse $\Phi red$ can be made to remain in an inactive level (low level) by setting the above-mentioned potential at a potential lower than the threshold voltage of the inverter IV1.

When the control signal $\Phi p$ goes to the active level and the input address codes (A1, A1b, A2, A2b, ..., An, and Anb) at that time agree with the address (00 ... 0) stored as in the above, the storage elements (F12, F22, ..., and Fn2) that are serially connected to the transistors (Q12, Q22, ..., and Qn2) that are to be turned on by these address codes are all blown, so that no current path will be formed between the output node N1 and the grounding potential point. As a result, the potential of the output node N1 goes to the power supply voltage Vss, and the reserve row/column activating signal $\Phi_{red}$ goes to the active level (high level) in response to this potential.

Figure 3:
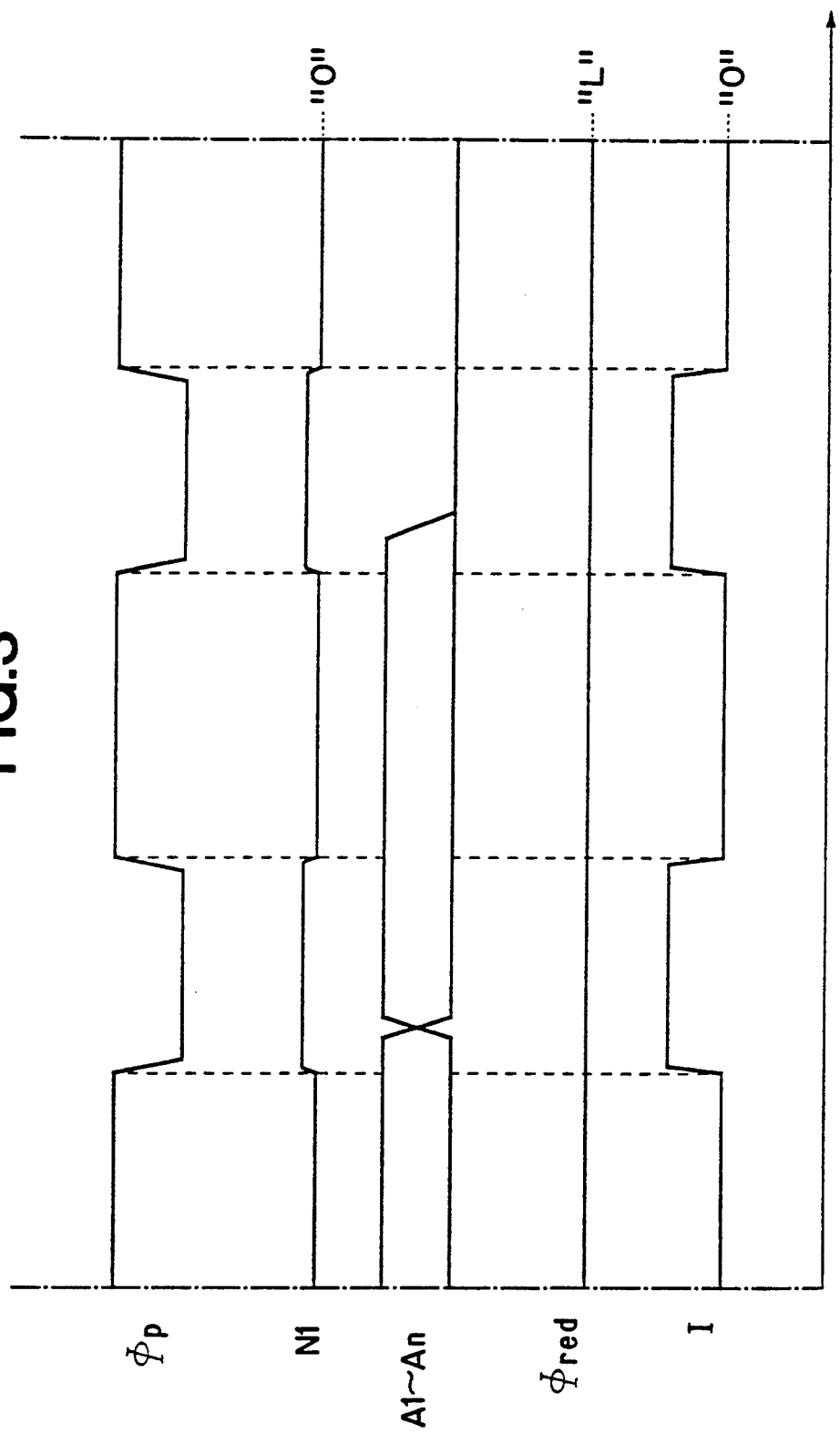
FIG. 3 is a signal waveform diagram for various parts in another operational mode of the embodiment.

Next, referring to FIG. 3, the operation of a surplus comparison and selection circuit 1 that is not required to store the address of the defective cell, namely, a circuit 1 in which the storage elements F11, F12, F21, F22, ..., Fn1, and Fn2 are not blown will be described. In this case, one half of the transistors Q11, Q12, Q21, Q22, ..., Qn1, and Qn2 are turned on by the combination of the true and complement numbers of the various bits of the input address codes. Therefore, there are formed a plurality of current paths between the output node N1 and the grounding potential point by the serial circuits of these transistors and the storage elements. As a result, a current I flows from the Vss power terminal through the fuse element F1, the transistor Q1 and the above-mentioned current circuit to the grounding potential point, bringing the potential of the output node N1 to a value lower than the threshold voltage of the inverter IV1, so that the output pulse $\Phi_{red}$ is held invariably at the inactive level (low level).

In spite of the fact that the output pulse $\Phi_{red}$ of a surplus comparison and selection circuit 1 is always at the low level and will activate neither one of the reserve row/column, the above-mentioned current I from the Vss power terminal to the grounding potential point is inevitably generated, which augments the power consumption of this memory chip in proportion to that extent.

Figure 4:
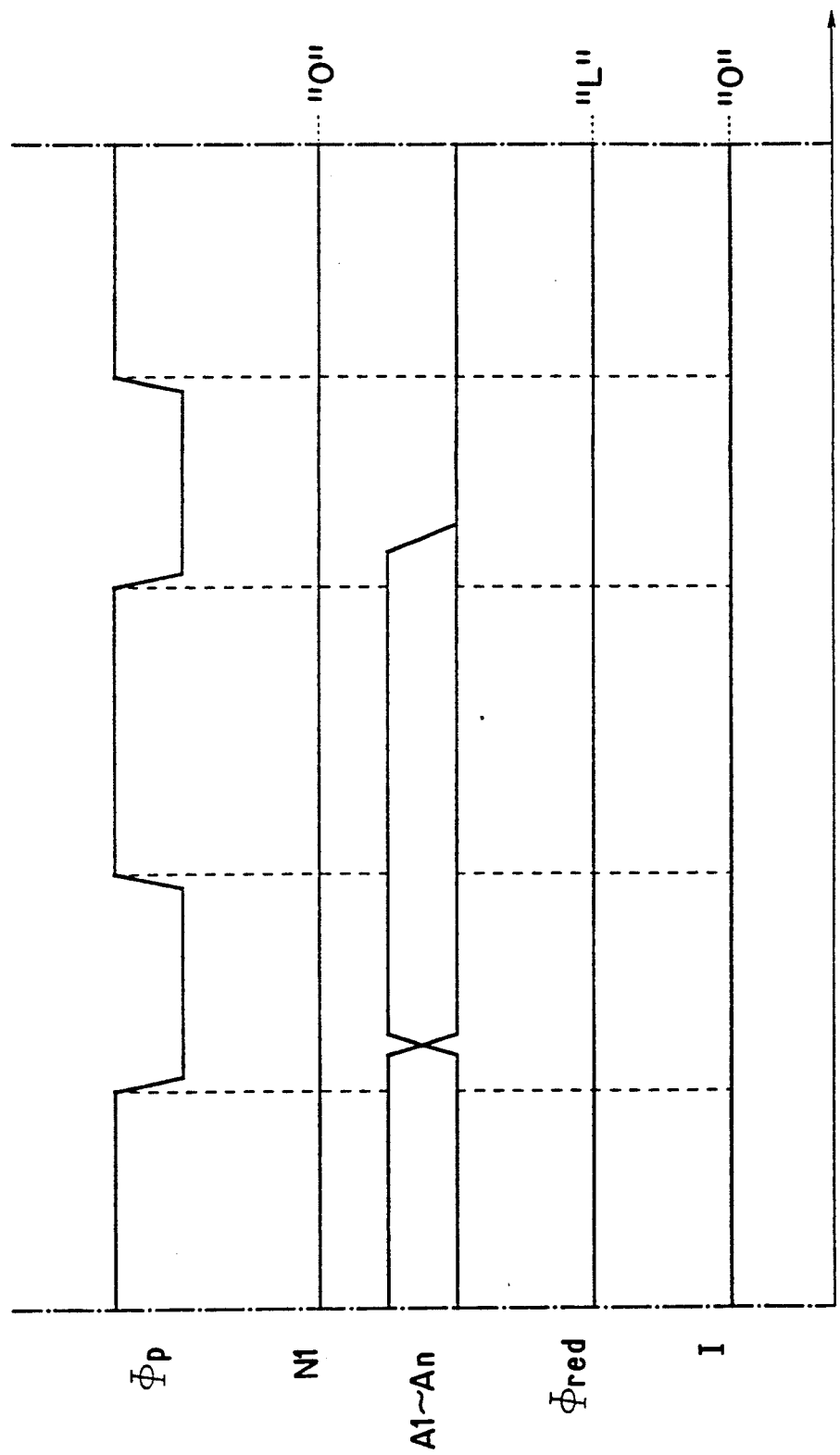
FIG. 4 is a signal waveform diagram for various parts in still another operational mode of the embodiment.

Under these circumstances, the fuse element F1 is inserted between the Vss terminal and the source electrode of the transistor Q1 in this embodiment. As for the surplus comparison and selection circuit 1 after completion of storage of all the addresses of the defective cells detected in the inspection process, the fuse element F1 of each driving circuit 2 is automatically blown during the inspection process. As a result of blowing the fuse element F1, the generation of the above-mentioned current I is eliminated as shown in FIG. 4, saving the power consumption accordingly.

Instead of inserting the fuse element F1 between the source electrode of the transistor Q1 and the Vss terminal as described in the above, one may connect the source electrode of the transistor Q1 directly to the Vss terminal and insert the element F1 between the drain electrode of the transistor Q1 and the output node N1.

Figure 5:
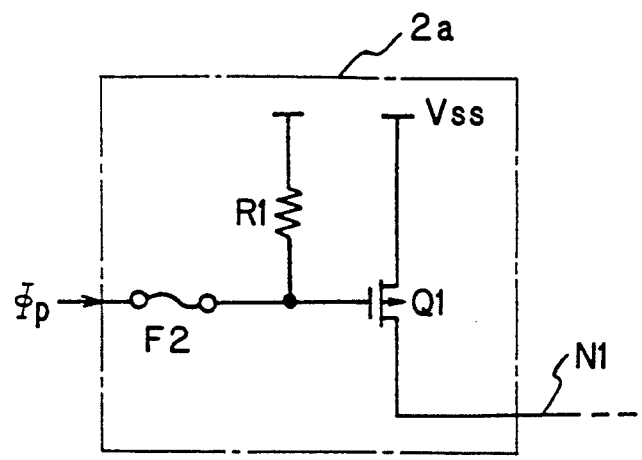
FIG. 5 is a modified circuit diagram for a part of the above-mentioned embodiment.

Referring to FIG. 5 which shows a modification 2a of the driving circuit 2 in the above-mentioned embodiment of the invention, the driving circuit 2a includes a transistor Q1 with its source electrode connected to the Vss terminal and its drain electrode connected to the output node N1, a resistor element R1 connected between the gate electrode of the transistor Q1 and the Vss terminal, and a fuse element F2 with one of its terminals receiving the reserve row/column replacement control signal $\Phi_p$ and its other terminal connected to the gate electrode of the transistor Q1. In this modification, the resistance of the resistor element R1 is set to have a value which will not adversely affect the operation of turning on or off the transistor Q1 by the control signal $\Phi_p$, and yet secures the off-state of the transistor Q1 by blowing the fuse F2.

In this modification the current that flows in the fuse element F2 can be made substantially smaller compared with the current that flows in the fuse element F1 in the aforementioned embodiment, so that the size of the modification can be reduced.

Although the invention has been described with reference to a specific embodiment and its modifications, this description is not meant to be construed in a limiting sense. Various modifications of the disclosed embodiment, as well as other embodiments of the invention, will become apparent to persons skilled in the art upon reference to the description of the invention. It is therefore contemplated that appended claims will cover any modifications or embodiments as fall within the true scope of the invention.

I claim:

1. In a monolithic semiconductor redundant memory device including an ordinary memory cell array which includes a large number of word lines arranged parallel with each other in row direction and a large number of bit lines arranged parallel in column direction and a large number of memory cells arranged respectively at the intersections of these word lines and the bit lines, a row decoder and a column decoder which select one of said word lines and one of said bit lines, respectively, in response to an input address code, a large number of sense amplifiers/bit drivers that are respectively connected to said bit lines, reserve rows and reserve columns consisting of a large number of reserve memory cells arranged in the row and the column directions adjacent to said ordinary memory cell array so as to enable to replace functionally insufficient defective cells among said large number of memory cells in the unit of row or column to which these defective cells belong, comparison and selection means which stores and address of said defective cell detected during an inspection process and selectively activates one of said reserve rows or said reserve columns in response to an agreement of said input address code word and an address of a stored defective cell, and means arranged in one to one correspondence to the comparison and selection means for supplying a driving pulse from an operating power source to the corresponding comparison and selection means; the improvement wherein, for surplus units of said comparison and selection means which are not required to store the addresses of said defective cells, each of said driving pulse supply means includes means for inhibiting a supply of the operating power source voltage so as to make it possible to inhibit the supply of the operating power source voltage to said corresponding driving pulse supply means and said corresponding comparison and selection means.

2. A redundant memory device as claimed in claim 1, wherein storage, in said comparison and selection means which are not required to store the addresses of said defective cells, of the redundant memory device, specification of said surplus comparison and selection means, and setting of said operating power source voltage supply inhibiting means corresponding to said specified surplus comparison and selection means are carried out during the inspection process.

3. A redundant memory device as claimed in claim 2, wherein said comparison and selection means consists of a plurality of bit comparison circuits connected in common to said driving pulse supply means each of which including a serial circuit consisting of a nonrewritable storage element and a switching MOSFET with one of its drain electrode and source electrode connected to a reference potential point, said input address code is supplied to the gate electrode of said switching MOSFET, and the storage of the address of said defective cell during said inspection process is carried out by making the bit "1" of the address corresponding to deenergization of said storage element.

4. A redundant memory device as claimed in claim 2, wherein said operating power source voltage supply inhibiting means of said driving pulse supply means includes a programmable fuse element.

5. A redundant memory device as claimed in claim 3, wherein said storage element includes a programmable fuse element.

6. A redundant memory device as claimed in claim 4, wherein said driving pulse supply means comprises a switching MOSFET the gate electrode of which is connected to a control signal $\Phi_p$, one of the source and drain electrodes of which is connected to said programmable fuse element, and the other of said source and drain electrodes of which is connected to a common connecting point of said comparison and selection means.

7. A redundant memory device as claimed in claim 4, wherein said driving pulse supply means comprises means for reducing the current that flows in said programmable fuse element, thereby allowing manufacture of a driving pulse supply means of a reduced size.

8. A redundant memory device as claimed in claim 7, wherein said means for reducing the current that flows in said programmable fuse element comprises a switching MOSFET one of the source and drain electrodes of which is connected to the operating power source voltage, the other one of the source and drain electrodes of which is connected to a common point of said comparison and selection means, the gate electrode of which is connected to the operating power source voltage through a resistor whose resistance value is set so as not to adversely affect the operation of turning on or off said switching MOSFET by a control signal $\Phi_p$, the gate electrode of said switching MOSFET also being connected to said control signal $\Phi_p$ through said programmable fuse element.

9. A redundant memory device as claimed in claim e, wherein said comparison and selection means is connected in series with an output circuit that generates an output pulse $\Phi_{red}$ when the comparison and selection circuit detects agreement between the address of said defective cell detected during said inspection process, and said input address code word.

10. A redundant memory device as claimed in claim 9, wherein said output circuit comprises means for holding said output pulse $\Phi_{red}$, even after a control signal $\Phi_p$ to the driving pulse supply means is turned off.

11. A redundant memory device as claimed in claim 10, wherein said means for holding said output pulse $\Phi_{red}$ comprises an inverter whose output is fed back to its input through a switching transistor.

* * * * *